(12) United States Patent
Voss et al.

(10) Patent No.: US 10,930,506 B2
(45) Date of Patent: Feb. 23, 2021

(54) GALLIDATION ASSISTED IMPURITY DOPING

(71) Applicant: Lawrence Livermore National Security, LLC, Livermore, CA (US)

(72) Inventors: Lars Voss, Livermore, CA (US); Daniel Max Dryden, Oakland, CA (US); Clint Frye, Livermore, CA (US); Sara Elizabeth Harrison, Fremont, CA (US); Rebecca J. Nikolic, Oakland, CA (US); Qinghui Shao, Fremont, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/446,460

(22) Filed: Jun. 19, 2019

(65) Prior Publication Data

US 2019/0393038 A1 Dec. 26, 2019

Related U.S. Application Data

(60) Provisional application No. 62/687,635, filed on Jun. 20, 2018.

(51) Int. Cl.
| | |
|---|---|
| *H01L 21/225* | (2006.01) |
| *H01L 21/324* | (2006.01) |
| *H01L 29/207* | (2006.01) |
| *H01L 29/20* | (2006.01) |
| *H01L 29/36* | (2006.01) |
| *H01L 21/285* | (2006.01) |

(52) U.S. Cl.
CPC .... *H01L 21/2258* (2013.01); *H01L 21/28575* (2013.01); *H01L 21/3245* (2013.01); *H01L 29/2003* (2013.01); *H01L 29/207* (2013.01); *H01L 29/36* (2013.01)

(58) Field of Classification Search
CPC ............. H01L 21/2258; H01L 21/3245; H01L 29/207; H01L 29/2003
See application file for complete search history.

(56) References Cited

U.S. PATENT DOCUMENTS

2001/0030329 A1* 10/2001 Ueta ...................... B82Y 20/00
257/103
2012/0068188 A1* 3/2012 Feigelson ............. H01L 21/324
257/76

(Continued)

OTHER PUBLICATIONS

Steckl et al., "Rare-Earth-Doped GaN: Growth, Properties, and Fabrication of Electroluminescent Devices," IEEE Journal of Selected Topics in Quantum Electronics, Vo. 8, No. 4, Jul./Aug. 2002, pp. 749-766.

(Continued)

*Primary Examiner* — Ahmed N Sefer
(74) *Attorney, Agent, or Firm* — Zilka-Kotab, P.C.

(57) ABSTRACT

In one embodiment, a product includes a structure comprising a material of a Group-III-nitride having a dopant, where a concentration of the dopant in the structure has a concentration gradient characteristic of diffusion of the dopant inward from at least a portion of a surface of the structure in a direction substantially normal to the portion of the surface. The structure has less than 1% decomposition of the Group-III-nitride at the surface of the structure.

30 Claims, 8 Drawing Sheets

(56) References Cited

U.S. PATENT DOCUMENTS

| | | | | |
|---|---|---|---|---|
| 2013/0056793 A1* | 3/2013 | Srinivasan | ........... | H01L 21/0237 257/183 |
| 2015/0060908 A1* | 3/2015 | Jain | ................. | H01L 31/035272 257/94 |
| 2016/0093495 A1* | 3/2016 | Agraffeil | ........... | H01L 21/26553 438/521 |
| 2016/0093510 A1* | 3/2016 | Agraffeil | ........... | H01L 21/26553 438/542 |

OTHER PUBLICATIONS

Basha et al., "Investigations of cobalt and carbon codoping in gallium nitride for spintronic applications," Journal of Magnetism and Magnetic Materials, vol. 324, 2012, pp. 1528-1533.

Yang et al., "P-Type GaN Formation by Mg Diffusion," Japanese Journal of Applied Physics, vol. 39, Part 2, No. 5A, May 1, 2000, pp. L390-L392.

Mendis, B., "Thermal Diffusion of Dopants in Silicon Carbide," A dissertation submitted to the Graduate Faculty of Auburn University, Aug. 4, 2012, pp. 1-206.

To et al., "Doping of GaN by Mg Diffusion," Conference on Optoelectronic and Microelectronic Materials and Devices, 2002, pp. 75-78, retrieved from https://www.researchgate.net/publication/4037906_Doping_of_GaN_by_Mg_diffusion.

Hull et al., "Thermodynamic modeling of the Ni—Al—Ga—N system," Journal of Materials Research, vol. 19, No. 6, Jun. 2004, pp. 1742-1751.

Wilson et al., "Thermal stability of implanted dopants in GaN," American Institute of Physics, Applied Physics Letters, vol. 66, No. 17, Apr. 24, 1995, pp. 2238-2240.

Khludkov et al., "Gallium Nitride as a Material for Spintronics," Russian Physics Journal, vol. 55, No. 8, Jan. 2013, pp. 903-909.

Greco et al., "Ohmic contacts to Gallium Nitride materials," Elsevier, Applied Surface Science, vol. 383, Apr. 13, 2016, pp. 324-345.

Ting et al., "Electrical and structural characteristics of tin-doped GaN thin films and its hetero-junction diode made all by RF reactive sputtering," Elsevier, Materials Science in Semiconductor Processing, vol. 59, 2017, pp. 50-55.

Yen et al., "P-type GaN Formed by Mg Diffusion Using Mg3N2 as the Mg Source," Springer, Proceedings of the 25th International Conference on the Physics of Semiconductors Part III, 2000, pp. 1501-1502.

Pan et al., "The doping of GaN with Mg diffusion," Elsevier, Solid-State Electronics, vol. 43, 1999, pp. 621-623.

Harafuji et al., "Magnesium Diffusion at Dislocation in Wurtzite-Type GaN Crystal," Japanese Journal of Applied Physics, vol. 44, No. 9A, 2005, pp. 6495-6504.

Chang et al., "Study of Mg diffusion during metalorganic chemical vapor deposition of GaN and AlGaN," American Institute of Physics, Applied Physics Letters, vol. 74, No. 5, Feb. 1, 1999, pp. 688-690.

* cited by examiner

GALLIDATION ASSISTED IMPURITY DOPING

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to p-doped gallium nitride, and more particularly, this invention relates to gallidation assisted impurity doping.

BACKGROUND

P-type Gallium Nitride (GaN) was first demonstrated by metal-organic chemical vapor deposition (MOCVD) growth of magnesium (Mg) doped GaN in the 1980s, as recognized by a Nobel Prize in Physics. The importance of p-type doping of GaN is significant, as it has enabled the proliferation of light emitting diodes and laser diodes based on the III-Nitride system (indium nitride (InN,) GaN, aluminum nitride (AlN), and alloys thereof). In addition, p-GaN is useful in high power electronics such as diodes and transistors. The high breakdown strength and excellent transport properties of GaN has made GaN an attractive leading candidate to replace silicon (Si) and silicon carbide (SiC) power electronics in power grids, electric vehicles, and elsewhere.

Growth of p-type Mg doped GaN is limiting in that the Mg is introduced in the final layer of growth. Moreover, it is challenging to grow a sidewall of a 3D structure with p-type doped GaN by repeated etching and growing steps because once the interface is exposed, it becomes susceptible to oxidation and degradation of the sidewall efficacy.

Moreover, post-growth p-type doping of GaN has remained elusive. Technologies such as implantation and activation of Mg or diffusion of Mg into GaN are highly attractive, as each would enable selective area doping of GaN and lateral variation of p-type doping level, as preferred by numerous devices. Moreover, these technologies may enhance breakdown fields in existing devices by incorporating certain kinds of edge termination techniques, such as Junction Termination Extensions (JTE).

Conventional p-type doping post growth includes ion implantation into GaN, but these methods are challenging because the temperatures for annealing are high, i.e., greater than 1200° C., which degrades the GaN and severely limits when the annealing can be done in the process. One study includes a specialized rapid thermal annealing system capable of operating at high pressure and delivering rapid pulses to >1300° C. from a baseline of 1100-1200° C., with pulses on the order of several seconds. Another recent study shows high activation percentage by using a precise dose of Mg to limit formation of damage following 1250° C. annealing.

Several drawbacks exist with these studies, for instance, the specialized rapid thermal annealing system relies on a specialized piece of equipment that operates at high pressure, higher than the atmospheric pressure of nitrogen (N) to prevent N from coming out of the GaN, and also operates at high temperature of 1100-1200° C. with repeated spikes of temperature over 1300° C. in bursts of a few seconds each. The reliance on this highly specific and specialized piece of equipment is limiting. In addition, the high baseline temperature and repeated greater than 1300° C. temperatures limit the possibility of pre-processing of the GaN. Thus, the activation cycle of the GaN would be the very first step due to the high temperatures involved; for example, metal could not be added to the GaN prior to activation, and dielectrics could not be added to the GaN prior to activation.

In the latter case using a precise dose of Mg to limit damage, high hole concentrations were only achieved for one specific dose thereby limiting the utility. In both cases, the preferred very high temperatures (>1200° C.) included the use of an AlN cap layer to prevent decomposition of the GaN. Decomposition can begin at 700-800° C., but becomes extremely significant at temperatures >1000° C. The combination of the AlN cap to prevent decomposition and the high temperatures used in such systems places a strict limitation on when the implantation and activation can be performed in the process. Thus, the implantation and activation preferably are completed as a first step before any etching or metallization.

Moreover, ion implantation tends to cause damage to the crystal lattice of the GaN. The damaging effects are due to high energy of the ions combined with the high temperatures of the implantation process, because the diffusivity of Mg in GaN is so low.

Furthermore, ion implantation tends to be limited to line of sight, thereby limiting the utility thereof mainly to 2D structures. Thus, ion implantation onto the sidewall of a vertical 3D structure would be extremely challenging to the extent that ion implantation onto the sidewall of a 3D structure may not be possible. Moreover, ion implantation is typically performed at 7° tilt from normal. Implanting at an angle of 7° tilt from normal onto a sidewall (effectively 83° from normal) may result in deflection of most incident ions, rather than implantation.

Early reports of diffusion of Mg into GaN include methods requiring long time periods (many hours), elevated temperatures, and have produced decidedly mixed results suggesting that other Ga—Mg compounds were formed. The low diffusivity of Mg in GaN at high temperatures of >1000° C. is essentially immeasurable. The diffusivity is so low, the Mg does not move. Moreover, these early reports of using high temperatures for diffusing Mg did not appear to effectively dope the GaN.

For these reasons, it would be desirable to activate GaN at a lower temperature and using shorter diffusion times. Moreover, selective area processing that could be incorporated into GaN devices at various stages of processing would be preferable.

SUMMARY

In one embodiment, a product includes a structure comprising a material of a Group-III-nitride having a dopant, where a concentration of the dopant in the structure has a concentration gradient characteristic of diffusion of the dopant inward from at least a portion of a surface of the structure in a direction substantially normal to the portion of the surface. The structure has less than 1% decomposition of the Group-III-nitride at the surface of the structure.

In another embodiment, a method of Group-III-nitride material-assisted impurity diffusion to form a product includes depositing a source layer on a surface of a substrate, depositing a cap layer above the source layer wherein the source layer includes a dopant, and applying a thermal annealing treatment to the substrate and deposited layers for causing diffusion of at least some of the at least one element from the substrate to the cap layer, and for causing diffusion of the dopant from the source layer to a former location of the at least one element in the substrate thereby changing a conductivity and/or magnetic characteristic of the substrate. The substrate comprises a Group-III-nitride material having a compound of nitrogen and at least one element selected from the group consisting of: gallium, aluminum, indium, boron, and thallium.

In yet another embodiment, a method for activating magnesium-doped gallium nitride includes doping magnesium into a substrate comprising gallium nitride, depositing a cap layer above the substrate, and applying a thermal annealing treatment to the substrate and deposited cap layer for causing diffusion of gallium from the substrate to the cap layer, and for activating the magnesium to a former location of the diffused gallium in the substrate.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As also used herein, the term "about" when combined with a value refers to plus and minus 10% of the reference value. For example, a length of about 1 µm refers to a length of 1 µm±0.1 µm.

It is also noted that, as used in the specification and the appended claims, wt % is defined as the percentage of weight of a particular component is to the total weight of the mixture. Moreover, mol % is defined as the percentage of moles of a particular component is to the total moles of the mixture.

The following description discloses several preferred embodiments of doped Group-III-nitride structures and methods of making same by Group III-element assisted impurity diffusion and/or related systems and methods.

In one general embodiment, a product includes a structure comprising a material of a Group-III-nitride having a dopant, where a concentration of the dopant in the structure has a concentration gradient characteristic of diffusion of the dopant inward from at least a portion of a surface of the structure in a direction substantially normal to the portion of the surface. The structure has less than 1% decomposition of the Group-III-nitride at the surface of the structure.

In another general embodiment, a method of Group-III-nitride material-assisted impurity diffusion to form a product includes depositing a source layer on a surface of a substrate, depositing a cap layer above the source layer wherein the source layer includes a dopant, and applying a thermal annealing treatment to the substrate and deposited layers for causing diffusion of at least some of the at least one element from the substrate to the cap layer, and for causing diffusion of the dopant from the source layer to a former location of the at least one element in the substrate thereby changing a conductivity and/or magnetic characteristic of the substrate. The substrate comprises a Group-III-nitride material having a compound of nitrogen and at least one element selected from the group consisting of: gallium, aluminum, indium, boron, and thallium.

In yet another general embodiment, a method for activating magnesium-doped gallium nitride includes doping magnesium into a substrate comprising gallium nitride, depositing a cap layer above the substrate, and applying a thermal annealing treatment to the substrate and deposited cap layer for causing diffusion of gallium from the substrate to the cap layer, and for activating the magnesium to a former location of the diffused gallium in the substrate.

A list of acronyms used in the description is provided below.

| | |
|---|---|
| 3D | Three dimensional |
| Au | Gold |
| C | Celsius |
| GAID | Gallidation assisted impurity diffusion |
| F | Fluorine |
| Ga | Gallium |
| GaN | Gallium Nitride |
| Mg | Magnesium |
| N | Nitrogen |
| Ni | Nickel |
| Pd | Palladium |
| Pt | Platinum |
| Si | Silicon |
| SiC | Silicon Carbide |
| SAID | Silicidation-assisted impurity doping |
| VAID | Vacancy-assisted ion diffusion |

According to various embodiments, a method is described for doping gallium nitride p-type with diffusion doping. In particular, some embodiments describe diffusing magnesium (Mg) into n-type or intrinsic gallium nitride (GaN) in order to create p-type gallium nitride at temperatures as low as 800° C. or lower, with high carrier concentration. Other embodiments may include diffusing into p-type gallium nitride to create regions with higher p-type doping. P-type doping of GaN is useful for numerous electronic and optoelectronic devices that rely on pn or PIN junctions to create a region within a semiconductor with an electric field such as laser diodes, light emitting diodes, switches, transistors, power diodes, etc. Moreover, GaN is a next generation power electronics material; for example, GaN may be useful in grid level switching, etc.

P-type doping of GaN has been a long-standing challenge. Typically, Mg p-GaN has been produced by crystal growth, more recently by implantation and activation, though this technique uses very high activation temperatures (>1200° C.) and specialized equipment.

One embodiment of the present invention includes a method for relatively low temperature (<1000° C.) diffusion of Mg into GaN by using a source layers such as a Mg-containing layer, as well as a capping layer, e.g., of platinum (Pt), palladium (Pd), gold (Au), or nickel (Ni), to modify the thermodynamics of the system and enhance the diffusion rate into GaN, and can be employed on three-dimensional (3D) structures. In various approaches, p-GaN with hole concentrations >$1 \times 10^{17}$ cm$^{-3}$ may be achievable, which may be comparable to state-of-the-art hole concentrations achieved using conventional grown p-type GaN.

Metal contacts to n-GaN are typically annealed in the range 700-1000° C., so temperatures less than 1000° C. may avoid metallic degradation. In preferred approaches, a temperature of 800° C. or below for a short duration of time (<1 hour, depending on the temperature) may limit decomposition of GaN to insignificant levels. Moreover, a diffusion process is preferable that would enable doping of virtually any 3D topology. Deposition of the diffusion source would also allow patterning using standard photolithographic techniques. Finally, diffusion should not pose the same issues of lattice damage created by ion implantation.

The advantages of various methods described herein include, a) the methods do not use specialized equipment, b) the temperature range for diffusion includes temperatures less than 1000° C., preferably less than 800° C., to allow better integration with post-doping processing, and c) 3D structures such as vertical pillars can be doped. The structure of p-type GaN with Mg filling some of the Ga sites formed by methods described herein has essentially no damage to the crystal lattice compared to the original pre-doped GaN. Moreover, the p-type doping of GaN by methods described herein allows further processing of the product, e.g., addition of metal film, dielectric layer, etc. after the activation cycle.

Figure 1A:
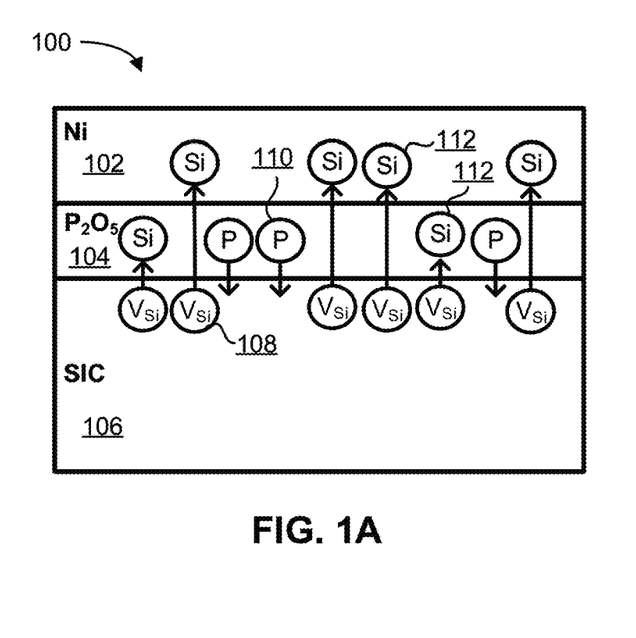
FIG. 1A is a schematic diagram of silicidation assisted impurity doping.

Various embodiments described herein demonstrate an effective technique for low temperature and short-time diffusion doping of GaN with Mg. In some approaches, the method is a vacancy-assisted ion diffusion (VAID) process for doping a material with a dopant. In one approach, the process includes gallidation-assisted impurity diffusion (GAID). A comparable process has previous been demonstrated in silicon carbide (SiC), using silicidation of metal contacts, e.g., Silicidation Assisted Impurity Doping (SAID) as shown in the process 100 of FIG. 1A. As Silicon (Si) 112 diffuses from a SiC layer 106 through the $P_2O_5$ layer 104 to the nickel (Ni) layer 102, a void ($V_{Si}$) 108 remains in the SiC layer 106. Phosphorus (P) 110 from the phosphorous pentoxide ($P_2O_5$) layer 104 diffuses to the void ($V_{Si}$) 108 in the SiC layer 106. In some instances, Si 112 may diffuse from the SiC layer 106 to the $P_2O_5$ layer 104.

Figure 1B:
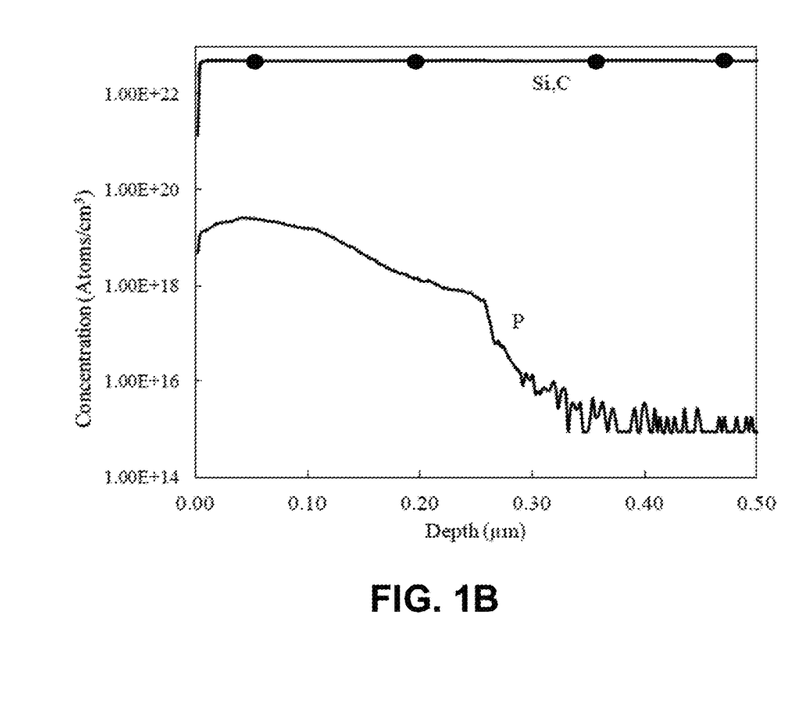
FIG. 1B is a plot of diffusion of P into a SiC layer.

FIG. 1B is a plot of the concentration of components (y-axis) in the SiC layer at increasing depths (x-axis) to show the diffusion of P into the SiC layer. The top curve (●) shows the concentration of Si and C in the SiC layer. The lower curve shows the concentration of P in the SiC layer, and confirms the presence of P in the SiC layer following diffusion by the process 100 described in FIG. 1A.

Figure 2A:
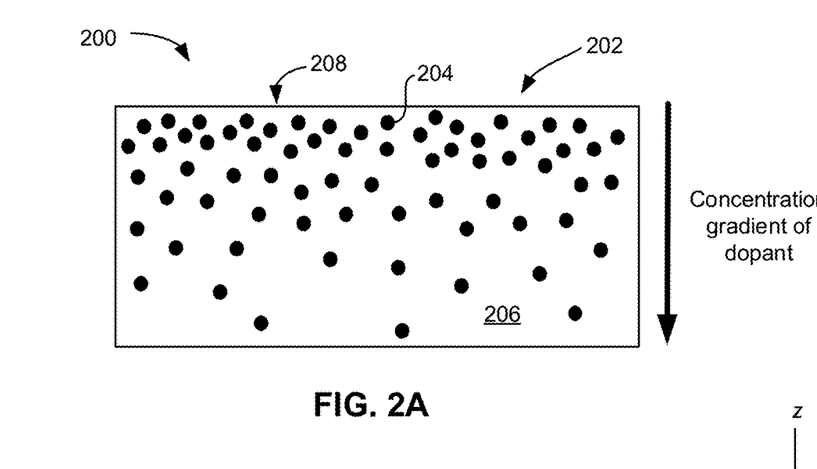
FIG. 2A is a schematic diagram of a structure having concentration gradient of a dopant in a substrate, according to one embodiment.

FIG. 2A depicts a product 200 having a doped Group-III-nitride material, in accordance with one embodiment. As an option, the present product 200 may be implemented in conjunction with features from any other embodiment listed herein, such as those described with reference to the other FIGS. Of course, however, such product 200 and others presented herein may be used in various applications and/or in permutations which may or may not be specifically described in the illustrative embodiments listed herein. Further, the product 200 presented herein may be used in any desired environment.

In one embodiment, a product 200 includes a structure 202 including a material of a Group-III-nitride 206 having a dopant 204 along at least a portion of the structure 202. A concentration of the dopant 204 in the structure 202 has a concentration gradient characteristic of diffusion of the dopant inward (arrow) from at least a portion of a surface 208 of the structure 202 in a direction substantially normal to the portion of the surface. For example, diffusion of the dopant from at least a portion of the surface 208 of the structure 202 is in a z-direction substantially perpendicular to the x-y plane of a portion of the surface 208 of the structure 202.

Moreover, the structure 202 has less than 1% decomposition of the Group-III-nitride 206 at the surface 208 of the structure 202. In one approach, the structure has less than 1% thermal degradation of the Group-III-nitride material at the surface of the structure. In one approach, the structure has less than 1% loss of nitrogen from the Group-III-nitride material at the surface of the structure as may be measured by the stoichiometry of the Group-III element to nitride (e.g., for GaN, measure the Ga to N at the surface of the structure). As would be understood by one skilled in the art, thermal degradation of a doped Group-III-nitride is manifested by a loss of nitrogen from the structure. In some approaches, the structure has substantially no degradation of the Group-III-nitride material at the surface of the structure where the surface may have the greatest concentration of dopant following diffusion of the dopant into the structure.

Figure 2B:
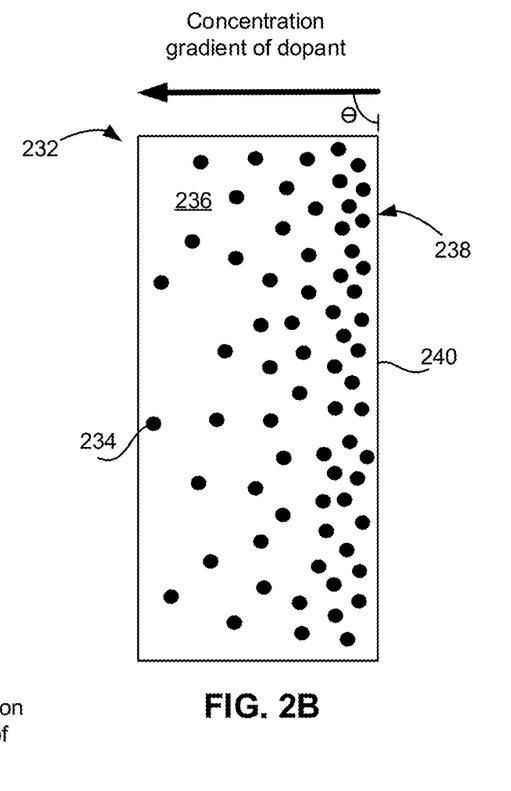
FIG. 2B is a schematic diagram of a structure having concentration gradient of a dopant in a sidewall of a substrate, according to one embodiment.

In one approach, as shown in FIG. 2B, the structure 232 has a vertical sidewall 240 oriented in a z-direction substantially perpendicular to an x-y plane of deposition of the structure. A concentration of the dopant 234 extends inward (arrow) from the vertical sidewall 240 has a concentration gradient characteristic of diffusion of the dopant inward from at least a portion of a surface 238 of the vertical sidewall 240 in a direction substantially parallel to the x-y plane. In one approach, diffusion of the dopant 234 may be at an angle Θ of about 90° of normal to the x-y plane of deposition of the structure 232. In some approaches, diffusion of the dopant inward from at least a portion of the vertical sidewall may be at substantially 0° tilt from normal onto the sidewall, or essentially 90° of normal.

In various approaches, the structure has essentially no damage characteristic of ion implantation. In one approach, the structure has essentially no damage to the crystal lattice of the Group-III-nitride material. Ion implantation generates both Group III vacancies and nitride vacancies. For example, ion implantation of a GaN substrate generates gallium (Ga) and nitrogen (N) vacancies. While Ga vacancies are desirable for activation, N vacancies are detrimental to p-type doping because N vacancies are n-type defects. In some approaches, the structure does not have N vacancies in the substrate material following diffusion of the dopant into the substrate.

Further, ion implantation forms detrimental defect complexes in the Group-III-nitride material. Thus, in some approaches, the structure has essentially no detrimental defect complexes in the Group-III-nitride material following diffusion of the dopant into the substrate.

In one approach, the Group-III-nitride includes a compound of a nitrogen and at least one element of the following: gallium, aluminum, indium, boron, thallium, etc. In one approach, the Group-III-nitride may be a binary compound, for example GaN, InN, AN, BN, TlN, etc. In one approach, the Group-III-nitride may be a ternary compound, for example, InGaN, AlGaN, AlInN, etc. In one approach, the Group-III-nitride may be a quaternary compound, for example AlInGaN.

As shown in FIGS. 2A-2B, in some approaches, the doped-Group-III-nitride 206, 236 may have a p-type conductivity along at least the portion of the structure 202, 232. In one approach, the dopant may include magnesium.

In one approach, the product may include a junction termination extension (JTE) as demonstrated by a concentration gradient of the dopant in the Group-III-nitride material of the structure. In one approach, the structure 232 may include a JTE as shown in FIG. 2B at a vertical sidewall where the dopant 234 has a concentration gradient characteristic of diffusion of the dopant inward from at least a portion of a surface 238 of the vertical sidewall 240 in a direction substantially parallel to the x-y plane.

Figure 2C:
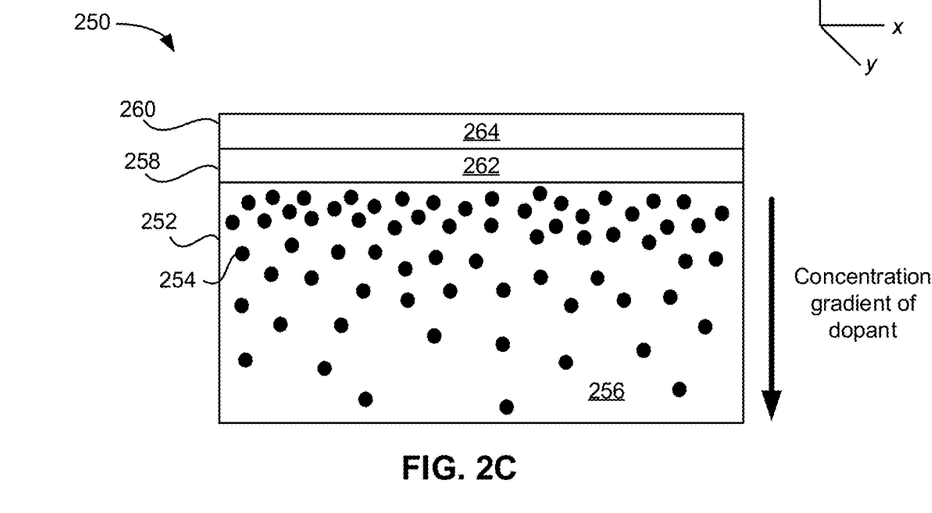
FIG. 2C is a schematic diagram of a product having an ohmic contact, according to one embodiment.

In one approach, the product may include an ohmic contact. As shown in FIG. 2C, a product 250 may include an ohmic contact having a structure 252, a layer 258 of a source material 262 on the structure 252 and the layer 258 being positioned relative to the structure 252, and a metal layer 260 sandwiching the layer 258 of source material 262 between the structure 252 and the metal layer 260. In one approach, the layer 258 is directly on a surface of the structure 252. In one approach, the layer 258 is positioned directly on a surface of the structure 252.

The structure 252 may include a material 256 of Group-III-nitride having a dopant 254. In one approach, the dopant 254 may be present in the material 256 in a concentration gradient characteristic of diffusion of the dopant inward from the source layer 258. In one approach the layer of source material of the dopant of the structure is positioned directly on the surface of the structure where the greatest concentration of dopant is present in the structure.

In one approach, the source material 262 includes the dopant 254. In preferred approaches, the source material 262 of the layer 258 positioned above the structure 252 includes magnesium.

In one approach of the product having an ohmic contact, the layer of source material of the dopant may be a layer in the metal layer. In another approach of the product having an ohmic contact, the layer of source material of the dopant may be mixed in the metal layer.

In some approaches, the metal 264 of the metal layer 260 may include at least one of the following: platinum, gold, nickel, palladium, a combination thereof. etc. These approaches are by way of example only, and are not meant to be limiting in any way.

In one approach, the structure may include a doped-Group-III-nitride that has an n-type conductivity along at least a portion of the structure. In various approaches, a dopant of the structure may include at least one of the following: silicon, germanium, tin, carbon, etc.

In some approaches, dopant of the Group-III-nitride material may include at least one of the following rare earth dopants: lanthanides, europium, samarium, erbium, etc.

In some approaches, dopant of the Group-III-nitride material may include at least one of the following: manganese, chromium, iron, nickel, vanadium, cobalt, gadolinium, etc.

Figure 3:
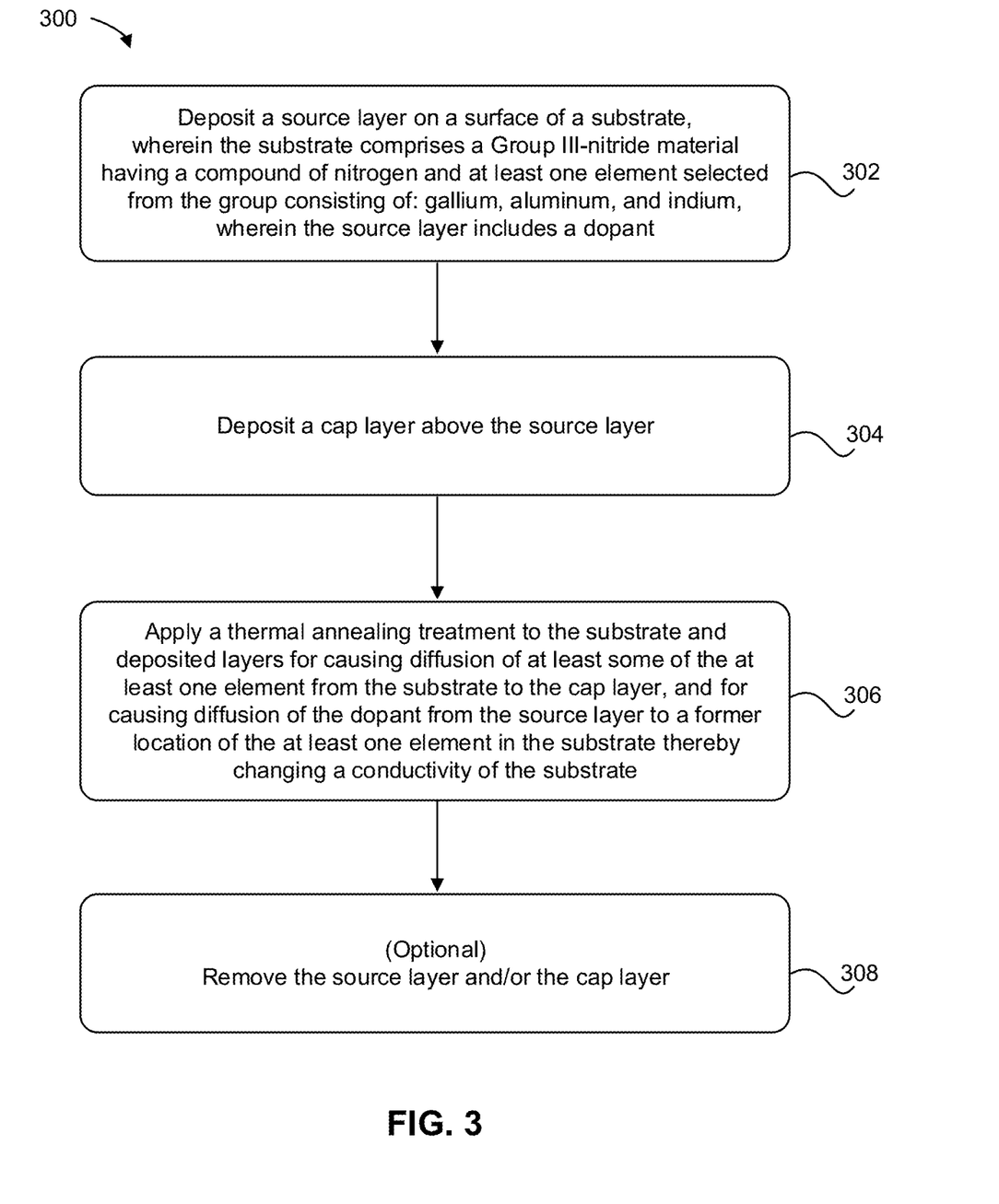
FIG. 3 is a flow chart of a method, according to one embodiment.

FIG. 3 shows a method 300 for Group-III-nitride assisted impurity diffusion, in accordance with one embodiment. As an option, the present method 300 may be implemented to dope other materials such as those shown in the other FIGS. described herein. Of course, however, this method 300 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 3 may be included in method 300, according to various embodiments. It should also be noted that any of the aforementioned features may be used in any of the embodiments described in accordance with the various methods.

Method 300 begins with step 302 of depositing a source layer on a surface of a substrate, wherein the substrate comprises a Group-III-nitride material having a compound of nitrogen and at least one of the following: gallium, aluminum, indium, boron, thallium, etc. In one approach, the source layer includes a dopant.

In some approaches, method 300 may include the following materials: InP, GaAs, $Ga_2O_3$, BN, Si, Ge, etc.).

According to an exemplary embodiment of this process, a GaN substrate may be coated with a two-layer structure including a source layer and a cap layer. In one approach, the source layer (e.g., a first layer, a layer of dopant, etc.) may be in contact with the GaN substrate. In one approach, the dopant of the source layer includes magnesium. In one approach the source layer may be a solid Mg source that may be selected from pure Mg, $MgF_2$, MgO, $Mg_3N_2$, $MgCl_2$, etc. In one approach, the source layer may include magnesium hydride ($MgH_2$). Table 1 lists some examples of Mg compound candidates for the solid Mg source, but is not meant to be limiting. In some approaches, pure Mg may be included as a solid Mg source. In some processes, preferably, none of these Mg sources react with GaN without a metal; thus, a metal cap

TABLE 1

Candidates of Mg Compounds

| Mg Compound | Melting Pt °C. | Boiling Pt °C. | Decomposition °C. | Soluble | Hazard |
|---|---|---|---|---|---|
| $Mg_3N_2$ | | | 800 | | |
| MgO | 2852 | 3600 | | water, acid, ammonia | 1/0/0 |
| $MgF_2$ | 1263 | 2260 | | | 3/0/0 |
| $MgCl_2$ | 714 | 1412 | 300 | water, acetone, pyridine | 1/0/0 |
| $MgBr_2$ | 711 | 1250 | yes | ethanol, methanol | 1/0/0 |
| $MgI_2$ | 637 | | yes | water, ether, alcohol, ammonia | 3/1/1 | layer may help pull the Ga out of the GaN layer. In preferred approaches, the Mg source has a melting point that is greater than 1000° C., but lower-melting-point Mg source materials may be used in conjunction with lower temperature processes, e.g., below the melting point of the respective Mg source material.

In some approaches, the source layer may include an n-type dopant. Exemplary examples of n-type dopants of the source layer for diffusing into the substrate during application of thermal treatment include the following: silicon, germanium, tin, carbon, combinations thereof, etc.

In one approach, the source layer may include a rare earth dopant for diffusing into the Group-III-nitride substrate. Exemplary examples of rare earth dopants include the following: lanthanides, europium, samarium, erbium, combinations thereof, etc.

For application in spintronic devices, the process described herein provides a method to fabricate doped Group-III-nitrides. In one approach, the source layer may include a dopant optimal for spintronic processes for diffusion into the Group-III-nitride (e.g., GaN) substrate. Exemplary examples of solid dopants for spintronic devices include the following: manganese, chromium, iron, nickel, vanadium, cobalt, gadolinium, combinations thereof, etc.

In various approaches, the source layer may be deposited on the substrate to form a vertical sidewall oriented in a z-direction substantially perpendicular to an x-y plane of deposition of the substrate. In one approach, the substrate may be a pillar, vertical structure having an aspect ratio h:w of greater than one, etc. and the source layer may be deposited on a vertical side of the substrate thereby forming a vertical sidewall between the substrate and the source layer.

Method 300 includes a step 304 of depositing a cap layer above the source layer relative to the source layer. The cap layer (e.g., a second layer, a metal layer, etc.) may be a metal or another material that is known to react with a Group-III-nitride to form a Group-III metal compound during thermal annealing. For example, the cap layer may include a metal that is known to react with GaN to form a gallium metal compound (e.g., gallide) during thermal annealing such as Pt, Pd, Au, Ni, etc. In one approach, the cap layer may include a combination or alloy of such metals. In preferred approaches, the cap layer includes metals that are known to react with GaN to form gallides (e.g. $Pt_2Ga$) at temperatures as low as 400° C.

Moreover, the metal of the cap layer preferably is one known not to form a nitride with the Group-III-nitride, so that the metal does not pull any of the nitrogen out of the Group-III-nitride substrate layer. The metal of the cap layer does not preferably react with the nitride of the Group-III-nitride substrate layer. For example, in exemplary approaches, a metal does not form a nitride with GaN and thus nitrogen is not pulled out of the GaN layer.

In various approaches, metals for the second layer (e.g. cap layer) that are favorable in terms of being thermally stable at the desired annealing temperature include metals with a melting point greater than 1000° C. In some approaches, the metal(s) included in the second layer have a melting point greater than 1100° C. In preferred approaches, the metal included in the cap layer has a melting point high enough to withstand the temperatures of the annealing step.

TABLE 2

| Enthalpy values of metal-rich gallide and aluminide intermediate phases | | |
|---|---|---|
| Metal | Phase | $\Delta H° f$ (kJ/mol · atom) |
| Ni | $Ni_3Ga$ | −26.5 |
|  | $Ni_3Al$ | −41.6 |
| Pd | $Pd_2Ga$ | −64 |
|  | $Pd_2Al$ | −87 |
| Au | AuGa | −24 |
|  | AuAl | −36 |
| Pt | $Pt_3Ga$ | −46 |
|  | $Pt_3Al$ | −50 |

In some approaches the metal(s) included in the second layer have a negative enthalpy of formation ($\Delta H°_f$) when reacting with GaN to form gallides and are thus thermodynamically favorable. Illustrative examples of metals in terms of having preferable melting points for the second layer include Ni, Au, Pt, Pd, etc. Table 2 lists values of $\Delta H°_f$ of metal-rich gallide and aluminide intermetallic phases. The metals listed in the first column are examples of illustrative metals for a second layer in which a more negative $\Delta H$ is more favorable thermodynamically.

In various approaches, illustrative examples of metals that react with GaN to form a gallide but also do not react with GaN to form a nitride include Pd, Pt, Ni, Au, etc. Exemplary metals to be included in a cap layer include Pd and Pt.

In one approach in which the substrate and source layer form a vertical sidewall therebetween, the cap layer may be deposited on the vertical side of the source layer opposite the vertical sidewall of the source layer adjacent to the substrate.

Step 306 of method 300 includes applying a thermal annealing treatment to the substrate and deposited layers for causing diffusion of at least some of the at least one element from the substrate to the cap layer, and for causing diffusion of the dopant from the source layer to a former location of the at least one element in the substrate thereby changing a conductivity of the substrate. One approach of step 306 includes causing diffusion of the dopant from the source layer to a former location of the at least one element in the substrate thereby changing a magnetic characteristic of the substrate. Another approach of step 306 includes causing diffusion of the dopant from the source layer to a former location of the at least one element in the substrate thereby changing a conductivity and a magnetic characteristic of the substrate. After deposition of the source layer and cap layer on the Group-III-nitride layer, the wafer may be subjected to thermal annealing.

In various approaches, applying the thermal annealing treatment causes diffusion of at least some molecules of the at least one element from the substrate to the cap layer, and causes diffusion of at least some molecules of magnesium from the source layer to the former location of some of the molecules of the at least one element in the substrate. In some approaches, applying the thermal annealing treatment may change the conductivity of the substrate from a n-type conductivity to a p-type conductivity.

A temperature for the thermal annealing treatment of step 306 may be in a range of greater than 200° C. to less than 1000° C. In preferred approaches, a temperature for the thermal annealing may be in a range of greater than 600° C. to less than 800° C. In an exemplary approach, a temperature for the thermal annealing treatment is preferably above 400° C.

The time duration of thermal annealing may be less than an hour, less than 30 minutes, less than 20 minutes, less than 15 minutes, less than 10 minutes, less than 5 minutes, less than 3 minutes, etc. for example, the time duration of annealing may be about 15 minutes, 14, 13, 12, 11, 10, 9, 8, 7, 6, 5, 4, 3, 2, 1, or fractions thereof. The process may include one annealing step, or several such annealing steps. The annealing time is considered to be the total time at temperature in a rapid thermal annealing system. In other systems, the time for the ramp up and down to the temperature may be considered if this time is comparable to the total time at temperature.

In some approaches, step 306 of applying a thermal annealing treatment may occur in an atmosphere, where the atmosphere includes hydrogen. In one approach, the thermal annealing treatment in an atmosphere including hydrogen may happen before diffusion of the Group-III-element to form a metal compound in the cap layer and the diffusion of the dopant to the substrate of Group-III-nitride. In one approach, the thermal annealing treatment in an atmosphere including hydrogen may happen during diffusion of the Group-III-element to form a metal compound in the cap layer and the diffusion of the dopant to the substrate of Group-III-nitride. In another approach, the thermal annealing treatment in an atmosphere including hydrogen may happen before and during diffusion of the Group-III-element to form a metal compound in the cap layer and the diffusion of the dopant to the substrate of Group-III-nitride.

In some approaches, hydrogen may be incorporated in the substrate of Group III nitride from a source layer having $MgH_2$, a source layer having other hydrogen-containing compounds, from thermal annealing treatment in an atmosphere of hydrogen, etc. In these approaches, an additional annealing step after diffusion may be used to remove hydrogen from the doped Group III substrate. In one approach, method 300 may include a step of removing hydrogen from the substrate after step 306 of the thermal annealing treatment. For example, hydrogen may be removed from a doped GaN substrate in a post diffusion activation step. In one approach, an additional thermal annealing treatment at a temperature around 800° C. (e.g., in a range of about 600° C. to about 900° C.) for a duration of time. In some approaches, the duration of time may be at least one hour to at about 12 hours, as would be generally understood by one skilled in the art.

In some approaches, step 306 of applying a thermal annealing treatment causes a diffusion of a dopant in the source layer to extend a concentration of the dopant inward from the surface of the substrate from the source layer.

In one approach, where the substrate and source layer form a vertical sidewall (e.g., the substrate is a pillar, vertical structure having an aspect ratio height:width of greater than 1), step 306 of applying a thermal treatment to the structure causes a diffusion of the dopant of the source layer to extend a concentration of the dopant inward from the source layer. The concentration gradient may be characteristic of diffusion of the dopant inward from at least a portion of a surface of the vertical sidewall in a direction substantially parallel to the x-y plane. In one approach, diffusion of the dopant may be at an angle of about 90° of normal to the x-y plane of deposition of the structure (as illustrated in vertical structure of FIG. 2B). In some approaches, diffusion of the dopant inward from at least a portion of the vertical sidewall may be at substantially 0° tilt from normal onto the sidewall, or essentially 90° of normal.

Figure 4:
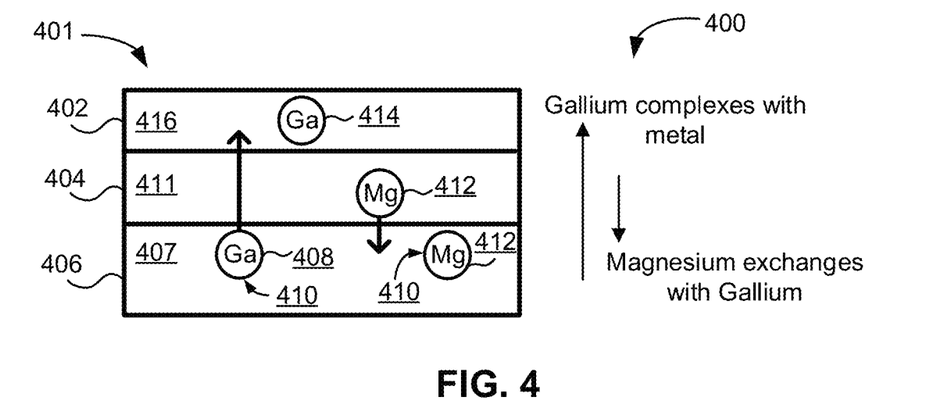
FIG. 4 is a schematic diagram of gallidation-assisted impurity diffusion, according to one embodiment.

FIG. 4 depicts a schematic drawing of a process 400 for Gallidation Assisted Impurity Diffusion (GAID), in accordance with one embodiment. As an option, the present process 400 may be implemented in conjunction with features from any other embodiment listed herein, such as those described with reference to the other FIGS. Of course, however, such process 400 and others presented herein may be used in various applications and/or in permutations which may or may not be specifically described in the illustrative embodiments listed herein. Further, the process 400 presented herein may be used in any desired environment.

As shown in the schematic diagram in FIG. 4, a source layer 404 may be positioned above a substrate 406 of GaN 407. In some approaches, the source layer 404 may include a form of magnesium 411 (e.g., $MgF_2$, Mg, etc.). A cap layer 402 (e.g., second layer, metal layer, etc.) may be positioned above the source layer 404. The cap layer 402 may include metals 416 such as the following: Pt, Au, Ni, Pd, etc.

In one approach where the source layer 404 is a Mg source layer, the Mg molecules 412 exchange locations at the Gallium (Ga) vacancy 410 when the Ga 408 diffuses from the GaN 407 of the substrate 406 to complex to form a compound 414 with a metal 416 in the cap layer 402.

In one approach, the thermal annealing treatment causes a diffusion of Ga 408 from the substrate 406 to the cap layer 402, where the Ga 408 forms a gallium metal compound 414 with the metal 416 of the cap layer 402. For example, and not meant to be limiting in any way, a cap layer having the metal platinum (Pt), may form the compound $Pt_2Ga$ in the cap layer with the Ga diffused from a GaN substrate.

Figure 5:
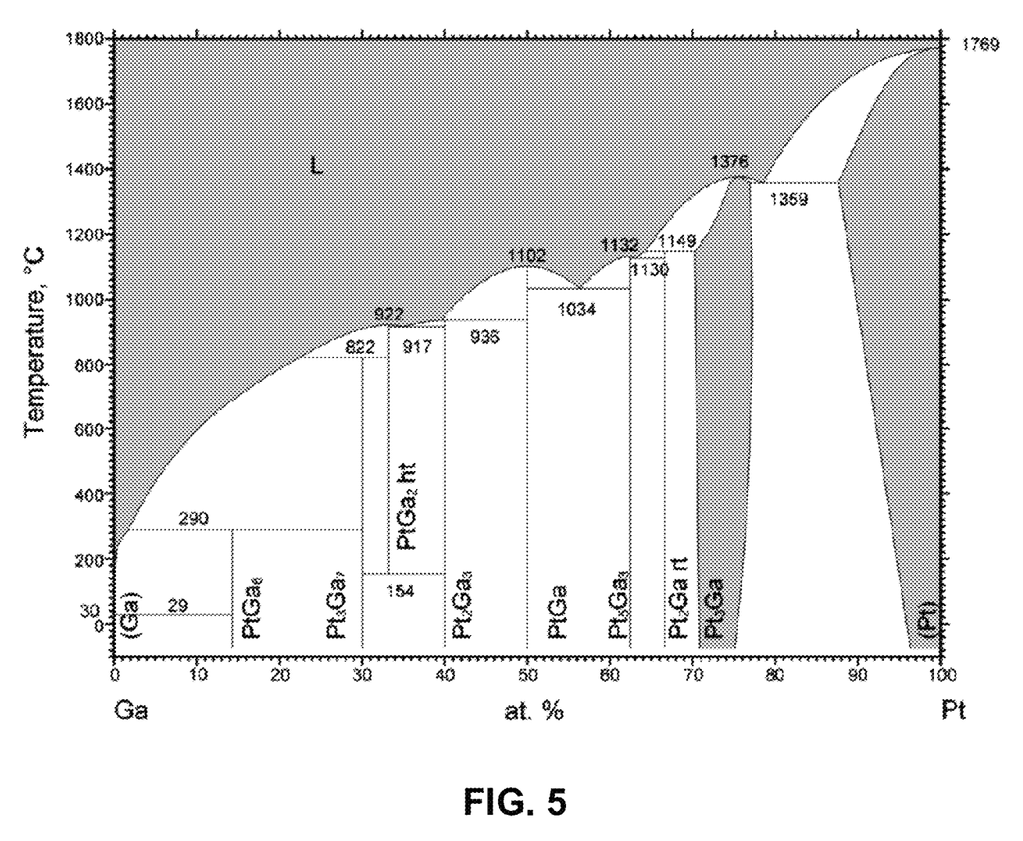
FIG. 5 is a phase diagram of Ga and Pt compounds.

FIG. 5 is a phase diagram of Ga and Pt, showing numerous Pt—Ga compounds relative to the temperature used in the annealing process. Conversely, a similar phase diagram of Pt—N(not shown) shows no Pt—N compounds. In one approach, gold (Au)also reacts with GaN producing similar type phase diagrams of forming Au—Ga compounds (but no Au—N compounds) as shown for Pt. In another approach, palladium (Pd) reacts with GaN producing similar type phase diagrams of forming Pd—Ga compounds (but no Pd—N compounds). In yet another approach, nickel (Ni) reacts with GaN producing similar type phase diagrams of forming Ni—Ga compounds (but no NI—N compounds). These approaches are by way of example only and are not meant to be limiting in any way.

Looking back to FIG. 4, in various approaches, Ga 408 may diffuse through the Mg source layer 404 to the second layer, creating a Ga vacancy 410 in the substrate 406 of GaN 407. This Ga vacancy 410 acts as a site for Mg 412 to diffuse into, thus enhancing the diffusivity of Mg 412 in a substrate 406 of GaN 407 significantly. In addition, because the Mg 412 may diffuse directly onto a Ga site, e.g., a Ga vacancy 410, the Mg 412 may already be electrically active and, thus, act as a dopant.

In some approaches, the first layer may be of sufficient thickness to prevent diffusion of the second layer to the surface, but thin enough to allow interaction between the GaN and the second layer. In a preferred approach, a thin layer of Mg source above a GaN layer and the Mg source layer capped with a metal such as Pd, Pt, etc. is annealed thereby diffusing the Ga out of the GaN layer through the Mg source and into the metal. Concurrently and/or subsequently, the Mg diffuses into the locations where the Ga was positioned. According to the described method, the temperature can be significantly lowered (relative to conventional techniques) while enabling the Mg to travel into the GaN layer. In various approaches, Mg may be diffused several hundred nanometers (nm) into the GaN, thereby forming a doped region with the desired p-type conductivity.

In various approaches, depth profiles (e.g. obtained after annealing at 800° C. for 15 min and at 1000° C. for 15 min) indicate significant Mg diffusion into the GaN. In some approaches, a Mg source may be chosen that can react with the Ga independent of a cap layer. For example, but not limited to, $MgF_2$ may react to form $GaF_3$.

Looking back to method 300 in FIG. 3, an optional step 308 includes removing the source layer and/or the cap layer. According to various approaches described herein the reacted coating (e.g. the first and second layers, source and cap layers, etc.) may be removed from the substrate having a changed conductivity. For example, looking to the structure 401 in FIG. 4, the source layer 404 and cap layer 402 may be removed from the Mg-doped GaN substrate 406 that has p-type conductivity.

Techniques to remove the reacted coating may include planarization, polishing, lapping, plasma etching, chemical etching, etc. In some approaches, removal of the reacted coating includes chemical etching steps, such as an etching step to react with the metal (e.g., submersion in boiling aqua regia to attack Pt), followed by an etching step to oxidize the Mg/Ga/F compound (e.g., application of a heated hydroxide), and a final etching step using a fluorine containing etch such as hydrofluoric acid (HF) or ammonium fluoride ($NH_4F$). For example, in one exemplary approach, a method includes etching in boiling aqua regia, etching in heated 44% KOH in $H_2O$ at 80° C., then etching in buffered oxide etch or another HF containing solution.

Figure 6:
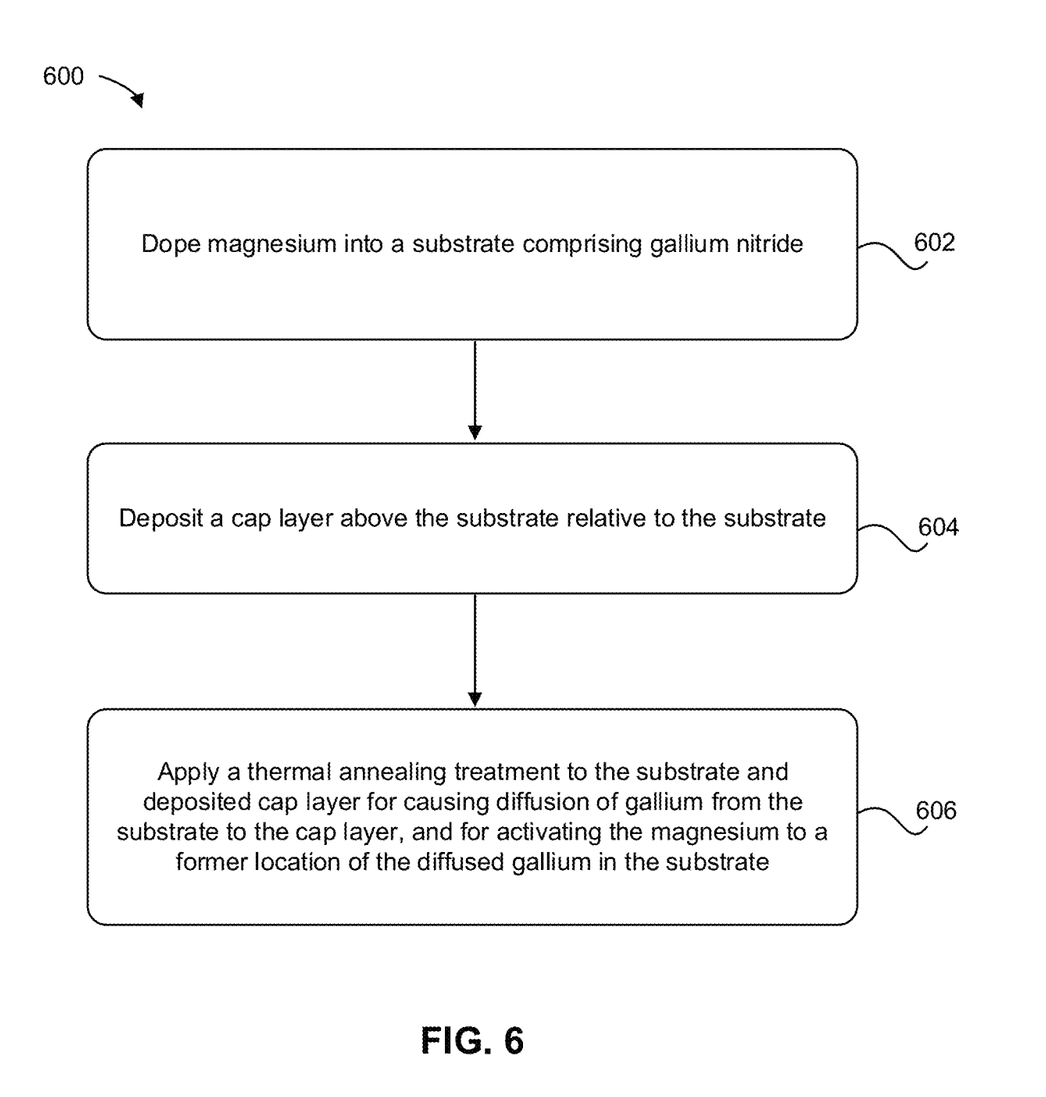
FIG. 6 is a flow chart of a method, according to one embodiment.

FIG. 6 shows a method 600 for activating magnesium-doped gallium nitride, in accordance with one embodiment. As an option, the present method 600 may be implemented to activate other materials such as those shown in the other FIGS. described herein. Of course, however, this method 600 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 6 may be included in method 600, according to various embodiments. It should also be noted that any of the aforementioned features may be used in any of the embodiments described in accordance with the various methods.

Method 600 begins with a substrate of magnesium-doped GaN. In some approaches, step 602 includes doping magnesium (Mg) into a substrate that includes gallium nitride (GaN). The processes for doping GaN may include ion implantation, conventional diffusion, diffusion process described herein, etc.

Step 604 of method 600 includes depositing a cap layer above the substrate relative to the substrate. In some approaches, the cap layer may be deposited directly on the surface of the substrate. In some approaches, the cap layer may be deposited directly on the upper surface of the substrate. In one approach, the cap layer may be deposited on a portion of the substrate.

As described in detail in method 300 of FIG. 3, the material of the cap layer of step 604 in method 600 includes a metal that forms a compound with gallium but does not react with the nitride of GaN. Exemplary metals that may be deposited as a cap layer include platinum, gold, nickel, palladium, combinations thereof, etc.

Step 606 of method 600 includes applying a thermal annealing treatment to the substrate and deposited cap layer for causing diffusion of gallium from the substrate to the cap layer, and for activating the magnesium to a former location of the diffused gallium in the substrate.

In various approaches, a temperature for the thermal annealing treatment may be a range of greater than 200° C. to less than 1000° C. In some approaches, a temperature for the thermal annealing treatment may be a range of greater than 600° C. to less than 800° C.

Experiments

Figure 7:
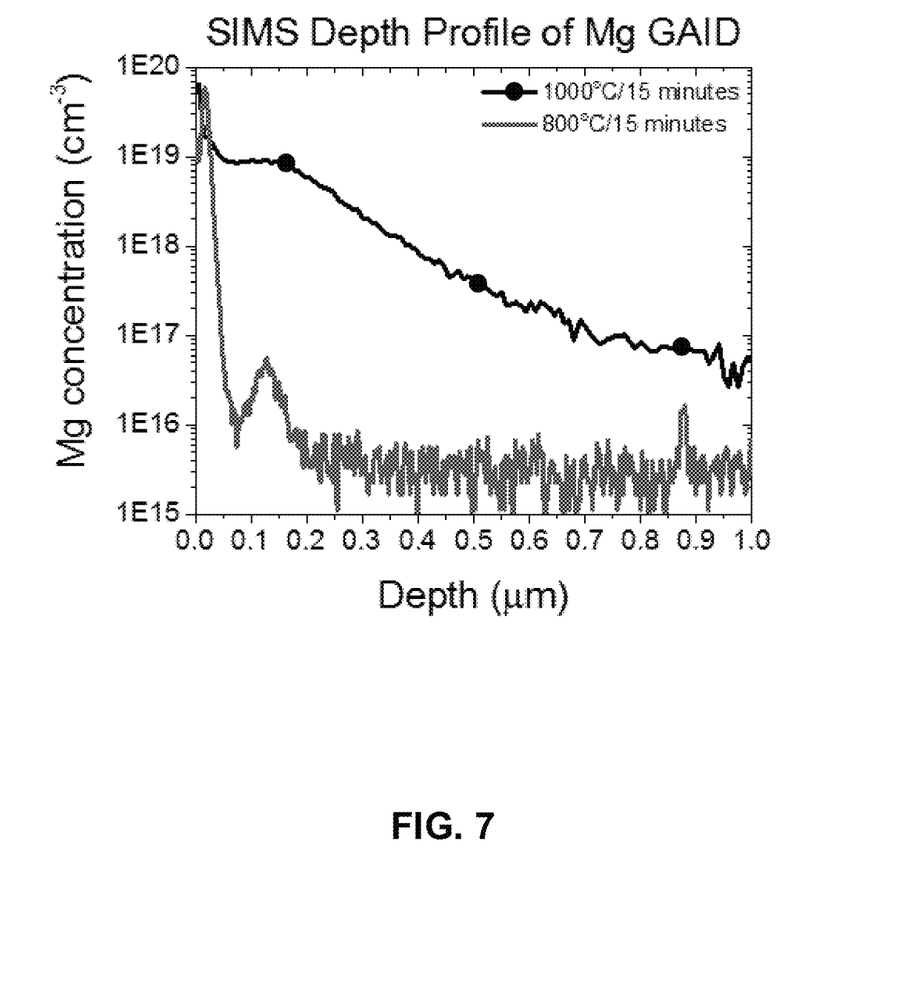
FIG. 7 is a plot of SIMS depth profile of magnesium-doped gallium nitride, according to one embodiment.

FIG. 7 is a plot of a depth profile of Mg into a GaN layer, according to one embodiment. The top curve (●) is a depth profile curve of Mg into the GaN layer at an annealing temperature of 1000° C. for 15 minutes. The bottom curve is a depth profile curve of Mg into the GaN at an annealing temperature of 800° C. for 15 minutes. The concentrations of Mg in GaN in each condition are in the range of $10^{15}$ to $10^{19}$, which, without wishing to be bound by any theory, are believed to be in the realm of possibility for Mg concentrations in a GaN layer.

Figure 8A:
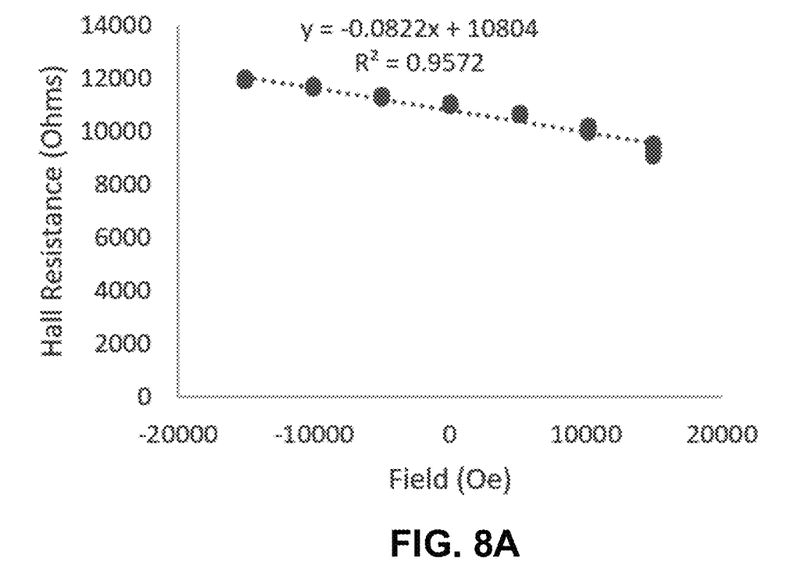
FIG. 8A is a plot of the Hall Effect of gallium nitride wafer having n-type conductivity, according to one embodiment.
Figure 8B:
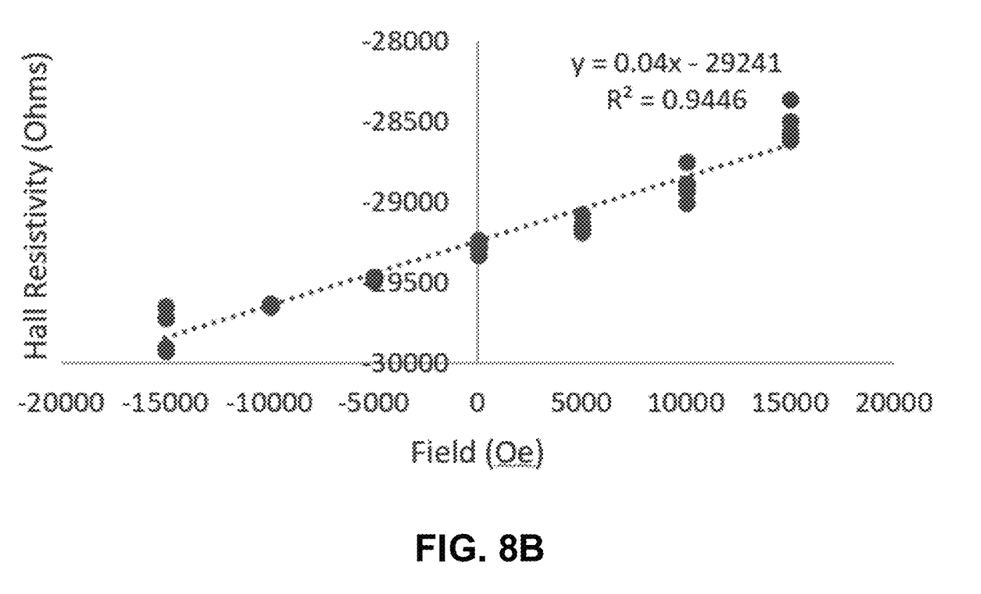
FIG. 8B is a plot of the Hall Effect of a gallium nitride wafer after vacancy-assisted ion diffusion of magnesium, according to one embodiment.

FIGS. 8A-8B depict plots of Hall Effect of p-type doping of a GaN material with Mg, according to one embodiment. FIG. 8A is the plot of a control material being a GaN wafer before diffusion, e.g. the n-type GaN before doping with Mg. The plot shows that the method begins with a wafer having n-type conductivity. FIG. 8B represents properties after diffusion of a GaN wafer at 800° C. for three minutes, following the process as described herein. As shown in FIG. 8B, the Hall Resistivity of the doped GaN wafer demonstrates a change in the slope that is consistent with a change in slope from a n-type material to p-type material.

In an exemplary approach, diffusion of Mg doping in GaN at 800° C. for three minutes has shown p-type doping (as shown in FIG. 8B), a sheet carrier density of $1.8 \times 10^{12}$ $cm^{-2}$, and a mobility of 13 $cm^2$/V-s, which is an expected mobility for p-GaN, as would be understood by one skilled in the art.

By carefully choosing the temperature and time of annealing, high carrier concentrations of p-GaN may be measured using Hall Effect. In exemplary approaches, using 100 nm of $MgF_2$ capped by 100 nm of Pt, which is then diffused at 800° C. for 3 minutes, may result in a sheet carrier concentration of 0.8 to $2 \times 10^{12}$ $cm^2$. Without wishing to be bound by any theory, this may translate to a likely carrier concentration of $3 \times 10^{17}$ $cm^{-3}$ to $8 \times 10^{17}$ $cm^{-3}$, based on a best estimate of amount of Mg.

IN USE

Various embodiments described herein may be used for Gallium nitride, light emitting diode, laser diode, transistor, MOSFET, JFET, vertical GaN, optoelectronics, power electronics, sensors, p-GaN, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
   a structure comprising a material of a Group-III-nitride having a dopant,
   wherein a concentration of the dopant in the structure has a concentration gradient characteristic of diffusion of the dopant inward from at least a portion of a surface of the structure in a direction substantially normal to the portion of the surface,
   wherein the structure has less than 1% decomposition of the Group-III-nitride at the surface of the structure.

2. A product as recited in claim 1, wherein the Group-III-nitride comprises a compound of a nitrogen and at least one element selected from the group consisting of: gallium, aluminum, indium, boron, and thallium.

3. A product as recited in claim 1, wherein the structure has a vertical sidewall oriented in a z-direction substantially perpendicular to an x-y plane of deposition of the structure, wherein a concentration of the dopant extending inward from the vertical sidewall has a concentration gradient characteristic of diffusion of the dopant inward from at least a portion of a surface of the vertical sidewall in a direction substantially parallel to the x-y plane.

4. A product as recited in claim 1, wherein the doped-Group-III-nitride has a p-type conductivity along at least the portion of the structure.

5. A product as recited in claim 1, wherein the dopant includes magnesium.

6. A product as recited in claim 5, wherein the structure has no damage characteristic of ion implantation.

7. A product as recited in claim 1, comprising an ohmic contact having the structure, a layer of magnesium on the structure, and
   a metal layer sandwiching the layer of magnesium between the structure and the metal layer.

8. A product as recited in claim 7, wherein a metal of the metal layer is selected from the group consisting of: platinum, gold, nickel, palladium, and a combination thereof.

9. A product as recited in claim 1, wherein doped-Group-III-nitride has a n-type conductivity.

10. A product as recited in claim 1, wherein the dopant is selected from the group consisting of: silicon, germanium, tin, and carbon.

11. A product as recited in claim 1, wherein the dopant is selected from the group of rare earth dopants consisting of: lanthanides, europium, samarium, and erbium.

12. A product as recited in claim 1, wherein the dopant is selected from the group consisting of: manganese, chromium, iron, nickel, vanadium, cobalt, and gadolinium.

13. A method of forming the product as recited in claim 1, the method comprising:
   depositing a source layer on a surface of a substrate, wherein the substrate comprises a Group-III-nitride material having a compound of nitrogen and at least one element selected from the group consisting of: gallium, aluminum, indium, boron, and thallium, wherein the source layer includes the dopant;
   depositing a cap layer above the source layer;
   applying a thermal annealing treatment to the substrate and deposited layers for causing diffusion of at least some of the at least one element from the substrate to the cap layer, and for causing diffusion of the dopant from the source layer to a former location of the at least one element in the substrate thereby changing a conductivity and/or magnetic characteristic of the substrate; and
   removing the source layer and/or cap layer.

14. A method as recited in claim 13, wherein a material of the cap layer includes a metal selected from the group consisting of:
   platinum, gold, nickel, palladium, and a combination thereof.

15. A method as recited in claim 14, wherein the Group-III-nitride material includes gallium nitride, wherein applying the thermal annealing treatment causes a diffusion of gallium from the substrate to the cap layer, wherein the gallium forms a gallium metal compound with the metal of the cap layer.

16. A method as recited in claim 13, wherein the dopant includes magnesium.

17. A method as recited in claim 16, wherein applying the thermal annealing treatment causes diffusion of at least some molecules of the at least one element from the substrate to the cap layer, and causes diffusion of at least some molecules of magnesium from the source layer to the former location of some of the at least some molecules of the at least one element in the substrate.

18. A method as recited in claim 13, wherein a material of the source layer includes a solid magnesium source selected from the group consisting of: $MgF_2$, pure Mg, MgO, $Mg_3N_2$, $MgCl_2$, $MgH_2$, and a combination thereof.

19. A method as recited in claim 13, wherein a temperature for the thermal annealing treatment is in a range of greater than 200 degrees Celsius to less than 1000 degrees Celsius.

20. A method as recited in claim 13, wherein a temperature for the thermal annealing treatment is in a range of greater than 600 degrees Celsius and less than 800 degrees Celsius.

21. A method as recited in claim 13, wherein the source layer includes an n-type dopant selected from the group consisting of:
   silicon, germanium, tin, carbon, and a combination thereof.

22. A method as recited in claim 13, wherein the source layer includes a rare earth dopant.

23. A method as recited in claim 13, wherein a time duration of the thermal annealing treatment is less than one hour.

24. A method as recited in claim 13, wherein a time duration of thermal treatment is less than 20 minutes.

25. A method as recited in claim 13, wherein a material of the source layer includes a solid dopant source selected from the group consisting of: manganese, chromium, iron, nickel, vanadium, cobalt, and gadolinium, and a combination thereof.

26. A method as recited in claim 13, wherein a material of the cap layer includes a metal having a melting point greater than 1000 degrees Celsius.

27. A method as recited in claim 13, wherein applying the thermal annealing treatment is in an atmosphere, wherein the atmosphere includes hydrogen.

28. A method as recited in claim 27, comprising, after the thermal annealing treatment, removing hydrogen from the substrate.

29. A method as recited in claim 13, wherein applying the thermal annealing treatment changes the conductivity of the substrate from a n-type conductivity to a p-type conductivity.

30. A method as recited in claim 13, wherein the source layer and/or the cap layer is removed using at least one process selected from the group consisting of: planarization, polishing, lapping, plasma etching, chemical etching, and a combination thereof.

* * * * *